United States Patent [19]

Thero et al.

[11] Patent Number: 5,571,374
[45] Date of Patent: Nov. 5, 1996

[54] METHOD OF ETCHING SILICON CARBIDE

[75] Inventors: Christine Thero, Scottsdale; Patricia A. Norton, Mesa, both of Ariz.

[73] Assignee: Motorola, Schaumburg, Ill.

[21] Appl. No.: 538,064

[22] Filed: Oct. 2, 1995

[51] Int. Cl.⁶ .................................................. H01L 21/00
[52] U.S. Cl. ................................ 156/643.1; 156/657.1; 156/659.11; 156/661.11; 216/41; 216/67; 216/79
[58] Field of Search ................................ 156/643.1, 646.1, 156/657.1, 659.11, 661.11; 216/2, 41, 67, 79; 257/79.1

[56] References Cited

U.S. PATENT DOCUMENTS 5,234,537  8/1993  Nagano et al. ..................... 216/79 X
5,254,215  10/1993  Terakado et al. .

Primary Examiner—William Powell
Attorney, Agent, or Firm—Robert F. Hightower

[57] ABSTRACT

A mask (12) is applied to a silicon carbide substrate (11) in order to etch the substrate (11). The material used for the mask (12) has a Mohs hardness factor greater than 4 in order to prevent sputtering material from the mask (12) onto the substrate (11). An oxygen and sulfur hexafluoride plasma is utilized to perform the etch.

7 Claims, 1 Drawing Sheet

METHOD OF ETCHING SILICON CARBIDE

BACKGROUND OF THE INVENTION

The present invention relates, in general, to semiconductor processing methods, and more particularly, to process techniques for silicon carbide semiconductors.

In the past, the semiconductor industry has utilized a variety of techniques for etching silicon carbide semiconductor material. Typically, a layer of aluminum is used as a mask during the etching of silicon carbide. The aluminum is formed on the silicon carbide and patterned to expose areas of the silicon carbide that are to be etched. The exposed silicon carbide is then exposed to a nitrogen fluoride and oxygen ($NF_3/O_2$) plasma to perform the etching. One problem is that the plasma sputters aluminum from the mask onto the substrate. The aluminum sputtered onto the substrate prevents uniform etching of the underlying silicon carbide, and can form a residue that prevents forming contacts to the silicon carbide.

Additionally, trenches formed by the plasma chemistry have substantially square corners. When the plasma chemistry is used to create mesa's for transistors, the square corners result in high electric fields at the corners which reduces the breakdown voltage of the transistor.

Accordingly, it is desirable to have a mask for etching silicon carbide that does not sputter material from the mask onto the silicon carbide during the etching process, and an etch chemistry that results in round corners.

DETAILED DESCRIPTION OF THE DRAWINGS

Figure 1:
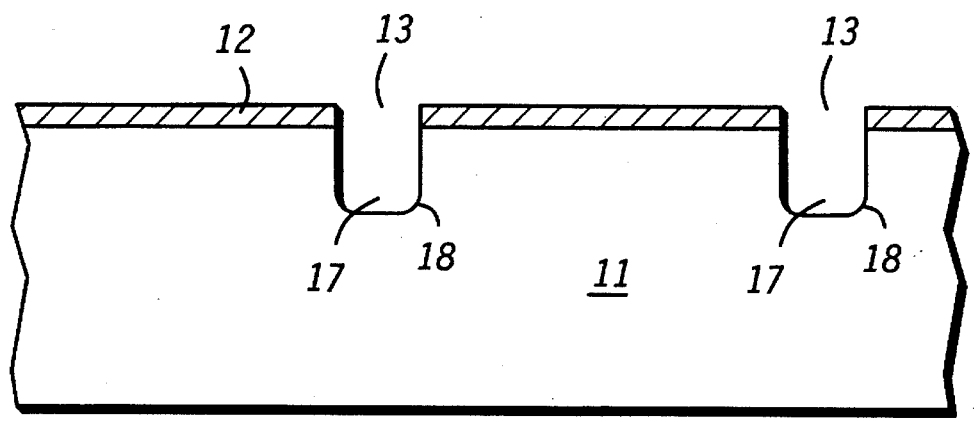
FIG. 1 illustrates an enlarged cross-sectional portion of a silicon carbide semiconductor device at a stage of manufacturing in accordance with the present invention.

FIG. 1 illustrates an enlarged cross-sectional portion of a silicon carbide semiconductor device 10 at a stage of manufacturing. Device 10 includes a substrate 11 having a surface that is to be etched. At the stage illustrated in FIG. 1, a mask layer 12 is formed on substrate 11 in order to etch portions of the surface of substrate 11. Mask layer 12 is formed from a material that substantially prevents sputtering of the mask material onto substrate 11 during the etching operation. It has been found that utilizing materials that have a Mohs hardness factor of approximately four or greater prevents sputtering of the material from mask layer 12 onto substrate 11 during etching of substrate 11.

In one embodiment, a layer of platinum is applied to the top surface of substrate 11 and then patterned to form openings 13 that expose areas of substrate 11 that are to be etched. The platinum thickness should be sufficient to ensure non-etching of areas that are to be protected by the platinum. An oxygen and sulfur hexafluoride ($O_2/SF_6$) plasma chemistry is utilized to ensure that rounded corners are produced during the etching. The preferred embodiment of the plasma etch chemistry is a mixture of eighty-five percent oxygen and fifteen percent sulfur hexafluoride. Such a mixture provides an anisotropic etch of the underlying substrate 11 and also produces rounded corners on trenches, mesas, and other structures formed by the etching. For example, the etching of substrate 11 produces trenches 17 having rounded corners 18. Subsequently, the platinum used for layer 12 is removed by an aqua regia etch.

In other embodiments, layer 12 can be lanthanum hexaboride ($LAB_6$), nickel, or a multilayer mask of titanium covered by platinum. In the preferred embodiment, layer 12 is nickel having a thickness of at least fifty nanometers because nickel is easily removed from the surface of substrate 11, aqua regia not required. Additionally, nickel is substantially unaffected by the oxygen and sulfur hexafluoride plasma. The fifty nanometer thickness is used to prevent etch of the underlying substrate 11. Nickel is removed from substrate 11 by a nitric acid etch.

Figure 2:
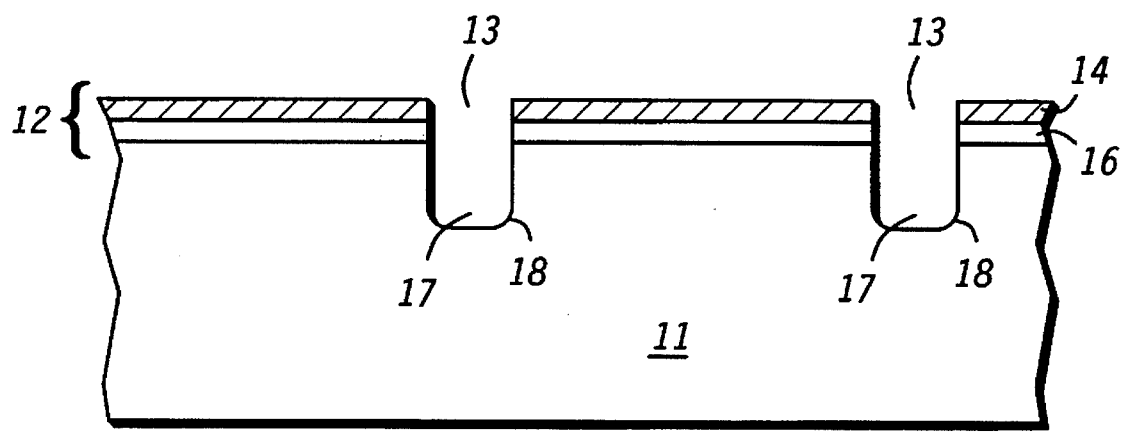
FIG. 2 illustrates an alternate embodiment of the silicon carbide semiconductor device of FIG. 1 in accordance with the present invention.

FIG. 2, illustrates an alternate embodiment of mask 12 used to form device 10. Elements of FIG. 2 that have the same reference numbers as FIG. 1 are the same as the corresponding FIG. 1 elements. As shown in FIG. 2, mask layer 12 is a multi-layer structure formed on substrate 11. Layer 12 includes a thin silicon dioxide layer 16 formed on substrate 11, and a platinum layer 14 that is applied to layer 16. Platinum layer 14 and silicon dioxide layer 16 are patterned to form openings 13 that expose areas of substrate 11 that are to be etched. By using silicon dioxide layer 16, platinum layer 14 can be removed by etching away layer 16, thus, eliminating the need to use aqua regia to remove the platinum.

By now it should be appreciated that there has been provided a novel way to etch silicon carbide. By utilizing a mask having a Mohs hardness factor of at least 4, material from the mask is not sputtered onto the underlying substrate. Consequently, residue from the mask is not on the surface of the substrate to prevent forming low resistivity ohmic contacts or to prevent etching underlying areas of the substrate that are intended to be etched. Using an oxygen and sulfur hexafluoride plasma etch chemistry provides round corners that reduce electric fields in resulting structures thereby increasing breakdown voltages of the structures.

We claim:

1. A method of etching silicon carbide comprising:
   providing a silicon carbide substrate;
   forming a mask layer by applying a layer of material on the substrate, the material having a Mohs hardness factor of four or greater;
   patterning the mask layer to expose underlying areas of the substrate; and
   etching the underlying areas of the substrate with a plasma.

2. The method of claim 1 wherein forming the mask layer includes applying a layer of silicon dioxide to the substrate and applying a layer of platinum to the silicon dioxide.

3. The method of claim 1 wherein forming the mask layer includes applying a layer of $LaB_6$ to the substrate.

4. The method of claim 1 wherein forming the mask layer includes applying a layer of nickel to the substrate.

5. The method of claim 4 wherein applying the layer of nickel includes applying at least 50 nanometers of nickel.

6. The method of claim 1 wherein etching the underlying areas includes using an oxygen and sulfur hexafluoride etch chemistry.

7. The method of claim 6 wherein using the oxygen and sulfur hexafluoride etch chemistry includes using a mixture of 85% oxygen and 15% sulfur hexafluoride.

* * * * *